(12) United States Patent
Park et al.

(10) Patent No.: US 7,205,241 B2
(45) Date of Patent: Apr. 17, 2007

(54) METHOD FOR MANUFACTURING SEMICONDUCTOR DEVICE WITH CONTACT BODY EXTENDED IN DIRECTION OF BIT LINE

(75) Inventors: Chang-min Park, Seoul (KR); Jung-hyeon Lee, Suwon (KR); Han-ku Cho, Seongnam (KR); Joon-soo Park, Gwacheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 363 days.

(21) Appl. No.: 10/731,931

(22) Filed: Dec. 10, 2003

(65) Prior Publication Data

US 2004/0127050 A1 Jul. 1, 2004

(30) Foreign Application Priority Data

Dec. 10, 2002 (KR) ...................... 10-2002-0078388

(51) Int. Cl.
*H01L 21/302* (2006.01)
(52) U.S. Cl. ...................... 438/694; 438/241; 438/622; 438/629; 438/707; 438/708; 438/719; 438/725; 438/734; 438/736; 438/942
(58) Field of Classification Search ................. 438/694
See application file for complete search history.

(56) References Cited

U.S. PATENT DOCUMENTS 5,817,562 A * 10/1998 Chang et al. ............... 438/305
6,403,413 B2 * 6/2002 Hayano et al. .............. 438/238
2001/0041406 A1 * 11/2001 Goebel et al. .............. 438/255
2001/0045589 A1 * 11/2001 Takeda et al. .............. 257/297
2002/0027259 A1 * 3/2002 Ikemasu et al. ............ 257/499
2002/0030222 A1 * 3/2002 Agarwal ..................... 257/310
2002/0034877 A1 * 3/2002 Shin et al. .................. 438/694

FOREIGN PATENT DOCUMENTS

JP          10284700        10/1998
KR          010095943       11/2001

OTHER PUBLICATIONS

English Abstract.

* cited by examiner

*Primary Examiner*—Shamim Ahmed
*Assistant Examiner*—Patricia A. George
(74) *Attorney, Agent, or Firm*—F. Chau & Associates, LLC

(57) ABSTRACT

Methods for manufacturing semiconductor devices with contact bodies extended in a direction of a bit line to increase the contact area between a contact body and a storage electrode is provided. In one aspect a method includes forming gate lines on a semiconductor substrate, forming a first insulating layer to cover the gate lines, forming first contact pads and second contact pads, which are electrically connected to the semiconductor substrate between the gate lines, by penetrating the first insulating layer. Further, a second insulating layer is formed to cover the first contact pads and the second contact pads, and bit lines are formed across over the gate lines and are electrically connected to the second contact pads by penetrating the second insulating layer. In addition, a third insulating layer is formed to cover the bit lines and is selectively etched to form a band-type opening that crosses the bit lines and exposes the first contact pads.

33 Claims, 16 Drawing Sheets

US 7,205,241 B2

METHOD FOR MANUFACTURING SEMICONDUCTOR DEVICE WITH CONTACT BODY EXTENDED IN DIRECTION OF BIT LINE

CROSS-REFERENCE TO RELATED APPLICATION

This application claims priority to Korean Patent Application No. 2002-0078388, filed on Dec. 10, 2002, which is incorporated herein by reference.

TECHNICAL FIELD OF THE INVENTION

The present invention relates to semiconductor devices. More specifically, the present invention relates to a method for manufacturing semiconductor devices with storage electrode contact bodies that extend in a direction toward a bit line to increase the contact area between a storage electrode contact body and a storage electrode of a capacitor.

BACKGROUND

As semiconductor devices become more highly integrated, the size of a transistor has been reduced, and the integration density of DRAM cells have increased, e.g., producing 1 giga-bit DRAM cells on a large scale.

Generally, a DRAM cell includes a single transistor and a capacitor, and the single-transistor DRAM cell requires the capacitor to store a sufficient charge to allow the cell state to remain true between refresh cycles. Further, a DRAM cell can be categorized as either a stacked cell or a trench cell depending on the method used in forming the cell capacitor. Referring to a stacked DRAM, there have been various approaches used to obtain a cell capacitor that occupies a smaller area to comply with a reduction in a design rule. For example, a method of increasing the height of a storage electrode of a capacitor, a method of increasing an effective surface area using hemispherical grains (HSG), and a method of utilizing both the inner and the outer areas of a cylinder through a capacitor of one cylinder storage (OCS) have been widely developed. In particular, it has been proposed that an OCS capacitor is the most likely type of capacitor to occupy a smaller area to comply with a future reduction in a design rule.

However, a conventional OCS capacitor causes twin bit failure. Twin bit failure occurs when a capacitor electrode in a DRAM cell falls down and contacts another capacitor electrode of another DRAM cell, thereby causing each DRAM cell to fail. In other words, a cylindrical capacitor electrode is prone to fall down when storage electrodes are 2-dimensionally disposed and a space interval therebetween is sharply reduced due to a reduction in the design rule.

FIG. 1 is a top plan view illustrating a semiconductor device with a conventional storage electrode.

Referring to FIG. 1, conventional storage electrodes 50 of an OCS capacitor are arranged at right angles to each other in a direction of a bit line 30 and a word line, i.e., a gate line 20. In a top plan view, storage electrodes 50 may be formed as rectangles, each of the storage electrodes having a major axis, e.g., in a direction of the bit line 30, and are disposed to be adjacent to each other in a direction of the bit line 30. In addition, the right-angled edges may be rounded as shown in FIG. 1. Further, the storage electrodes 50 formed as rectangles have a minor axis, e.g., in a direction of the gate line 20, and are disposed to be adjacent to each other in a direction of the gate line 20.

In a DRAM cell having a rectangular electrode and complying with a design rule of 0.1 μm, the size of the rectangle electrode in the major-axis direction would be about 300 nm and in the minor-axis direction would be about 120 nm. Therefore, a space interval between the storage electrodes 50 is no more than about 80 nm. Further, the height of the storage electrode 50 should be about 1500 nm to secure the capacitance required of a DRAM.

Accordingly, the height/width ratio of the cylindrical storage electrode 50 becomes 12 or more. Thus, the cylindrical storage electrode 50 is highly susceptible to falling down. When the storage electrodes 50 lean or fall, the storage electrodes come into contact with each other due to the very narrow space interval of 80 nm therebetween. Thus, a twin bit failure is experienced. As the design rule of a DRAM cell is reduced, e.g., to about 100 nm or less, the likelihood of the twin bit failure between storage electrodes also increases.

It has been recognized that the collapse of the storage electrodes 50 results from the arrangement of the storage electrodes 50 as illustrated in FIG. 1. For this reason, there have been many attempts to change the arrangement of the storage electrodes 50 to increase the space interval therebetween.

When the storage electrodes 50 are arranged as shown in FIG. 1, the storage electrodes 50 can be aligned with the contact bodies, which electrically connect the storage electrodes 50 with an active region 11, defined by a device isolation region 15 of a semiconductor substrate. However, if the arrangement of the storage electrodes 50 is altered, the contact bodies cannot be appropriately aligned with the storage electrodes 50. As illustrated in FIG. 1, in a conventional method, the storage electrodes 50 overlap the conductive buried contact pads 41, which are formed on the active region 11 of the semiconductor substrate. Further, if the storage electrodes 50 are arranged differently, the storage electrodes 50 may be misaligned with the conductive buried contact pads 41.

The conventional storage electrodes 50 are electrically connected to the active region 11 by buried contact pads 41 formed on the active region 11 of the semiconductor substrate and storage electrode contact bodies (not shown) formed thereon, for example, buried contacts. As illustrated in FIG. 1, when a center of the storage electrode 50 coincides with that of the buried contact pad 41, the storage electrode contact body may be formed between the storage electrode 50 and the buried contact pad 41 such that the center of the storage electrode contact body coincides with that of the buried contact pad 41. However, as described above, if the center of the storage electrode 50 is misaligned with the buried contact pad 41, it becomes difficult to align the center of the storage electrode 50 with that of the storage electrode contact body. Thus, the contact area between the storage electrode 50 and the storage electrode contact body is reduced, thereby causing defects due to an increase in the contact resistance.

Therefore, there is a need for a storage electrode contact body (not shown), i.e., a buried contact, having a new structure to be disposed between the conductive buried contact pad 41 and the storage electrode 50.

Further, a conductive direct contact pad 45 is disposed around the conductive buried contact pad 41. The conductive direct contact pad 45 is spaced apart from the conductive buried contact pad 41 and is used as a medium to electrically connect the active region 11 of the semiconductor substrate with a bit line 30. Thus, the storage electrode contact body, i.e., the buried contact with a new structure, which will be disposed between the conductive buried contact pad 41 and the storage electrode 50, should be sufficiently spaced apart from the direct contact pad 45 to prevent any defects from occurring, e.g., a short circuit.

Therefore, it is very difficult to dispose the storage electrode contact body or the buried contact with the new structure with a wider width to be aligned to the storage electrodes disposed in the new arrangement.

Accordingly, the storage electrode contact body should have a new structure to enable a smooth electrical connection between the storage electrodes 50 and the active region 11 of the semiconductor substrate. This makes it possible to change the planar structure of the storage electrode 50 or the arrangement of the adjacent storage electrodes 50 to prevent a collapse of the storage electrodes 50 of the OCS capacitor. In addition, the new storage electrode contact bodies should be embodied in consideration of a misaligned margin or an overlay margin between layers. In addition, to enhance process feasibility, a resolution limit in a photolithography process should be considered with a reduction in a design rule.

Therefore, a need exists for increasing the contact area between a storage electrode contact body and a storage electrode of a capacitor in a semiconductor device to prevent such occurrences as twin bit failure.

SUMMARY OF THE INVENTION

Exemplary embodiments of the invention include methods for manufacturing semiconductor devices with contact bodies that extend in the direction of a bit line to increase the contact area between a contact body and a storage electrode. Exemplary methods provide improvements in a misaligned margin, an overlay margin, or a process margin of elements that electrically connect the storage electrode with a semiconductor substrate.

In one exemplary embodiment of the invention, there is provided a method comprising forming gate lines on a semiconductor substrate, forming a first insulating layer to cover the gate lines, forming first contact pads and second contact pads, wherein the first and second contact pads are electrically connected to the semiconductor substrate between the gate lines, forming a second insulating layer to cover the first contact pads and the second contact pads, forming bit lines which cross over the gate lines and are electrically connected to the second contact pads by penetrating the second insulating layer, forming a third insulating layer to cover the bit lines, selectively etching the third insulating layer to form a band-type opening which crosses the bit lines and exposes the first contact pads, forming a conductive layer on the third insulating layer to fill the opening, patterning the conductive layer to form individual storage electrode contact bodies, each of which includes an extension that extends on the third insulating layer in a direction of the bit line and a body that is electrically connected to a first contact pad, and forming a storage electrode on each of the storage electrode contact bodies.

In another exemplary embodiment of the invention, the method may also include forming the storage electrode by forming an electrode supporting layer to cover the storage electrode contact bodies, forming a mold layer on the electrode supporting layer, patterning the mold layer to form a mold, wherein the mold forms the storage electrode into a 3-dimensional shape, forming a conductive layer on the mold, patterning the conductive layer to separate the conductive layer into individual storage electrodes, selectively removing the mold.

In yet another exemplary embodiment of the invention, there is provided a method for manufacturing a semiconductor device comprising selectively etching an insulating layer formed on a semiconductor device to form a band-type opening, wherein the opening crosses bit lines and exposes first contact pads which are electrically connected to an active region in the semiconductor device, forming a conductive layer on the insulating layer to fill the band-type opening, patterning the conductive layer to form individual storage electrode contact bodies, wherein each of the contact bodies includes an extension that is extended on the insulating layer in a direction of the bit line and a body that is electrically connected to a first contact pad, forming a storage electrode on each of the storage electrode contact bodies.

In still another exemplary embodiment of the invention, the method includes forming the storage electrode by forming an electrode supporting layer to cover the storage electrode contact bodies, forming a mold layer on the electrode supporting layer, patterning the mold layer to form a mold, wherein the mold forms the storage electrode into a 3-dimensional shape, forming a conductive layer on the mold, patterning the conductive layer to separate the conductive layer into individual storage electrodes, selectively removing the mold.

In still yet another exemplary embodiment of the invention, the method includes the electrode supporting layer comprising an etch stop layer that is used as an etch stopper when the mold is removed.

According to the exemplary embodiments of the present invention, contact bodies are formed to extend in a bit line direction to increase the contact area between a contact body and a storage electrode. Thus, a misalignment margin, an overlay margin, or a process margin of elements, which electrically connect the storage electrode to a semiconductor substrate, can be increased. In addition, the storage electrodes may be the storage electrodes arranged in a diagonal direction from the direction of the bit line or a gate line.

These and other exemplary embodiments, features, aspects, and advantages of the present invention will be described and become apparent from the following detailed description of the exemplary embodiments when read in conjunction with the accompanying drawings.

BRIEF DESCRIPTION OF THE DRAWINGS

FIGS. 2A and 2B through 9A and 9B, and FIGS. 10A through 10C are varying views illustrating methods for manufacturing semiconductor devices with contact bodies extending in a direction of a bit line to increase the contact area between a contact body and a storage electrode, according to exemplary embodiments of the present invention.

DETAILED DESCRIPTION OF EXEMPLARY EMBODIMENTS

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art.

Preferably, a buried contact, i.e., a storage electrode contact body, and a buried contact pad are used to electrically connect a storage electrode of a capacitor to a semiconductor substrate. Even though the storage electrodes are arranged at an angle to a bit line, i.e., in a diagonal direction from a direction of a bit line or a gate line (i.e., a word line), a portion of the storage electrode contact body extends in a direction of the bit line to increase the contact area between the storage electrode and the storage electrode contact body.

Also, preferably, an opening which is substantially the same shape as the storage electrode contact body is formed as a band type in a direction of the gate line. Also, a conductive layer is deposited to fill the band-type opening, and then photolithography and etching processes are carried out to separate the conductive layer into individual storage electrode contact bodies. By forming the band-type opening, process conditions, such as a process margin or resolution, can be achieved for a photolithography process. Also, the photolithography and etching processes for separating the conductive layer into the individual storage electrode contact bodies can increase the top surface area of each storage electrode contact body.

According to an exemplary embodiment of the present invention, the storage electrode contact body can have an increased top surface expanded in a direction of the bit line. Therefore, when the storage electrodes are arranged in a diagonal direction or a diagonal direction from the direction of the bit line or the gate line, the contact area between the storage electrode contact body and the storage electrode can be increased. Accordingly, in a plan view, the storage electrodes can be disposed in a new arrangement, thus increasing a space interval therebetween. This prevents the storage electrodes from falling and making contact with each other, thereby preventing twin bit failure.

FIGS. 2A and 2B through 9A and 9B, and FIGS. 10A through 10C are varying views illustrating methods for manufacturing semiconductor devices with contact bodies extended in a direction of a bit line to increase the contact area between a contact body and a storage electrode, according to exemplary embodiments of the present invention.

Figure 2A:
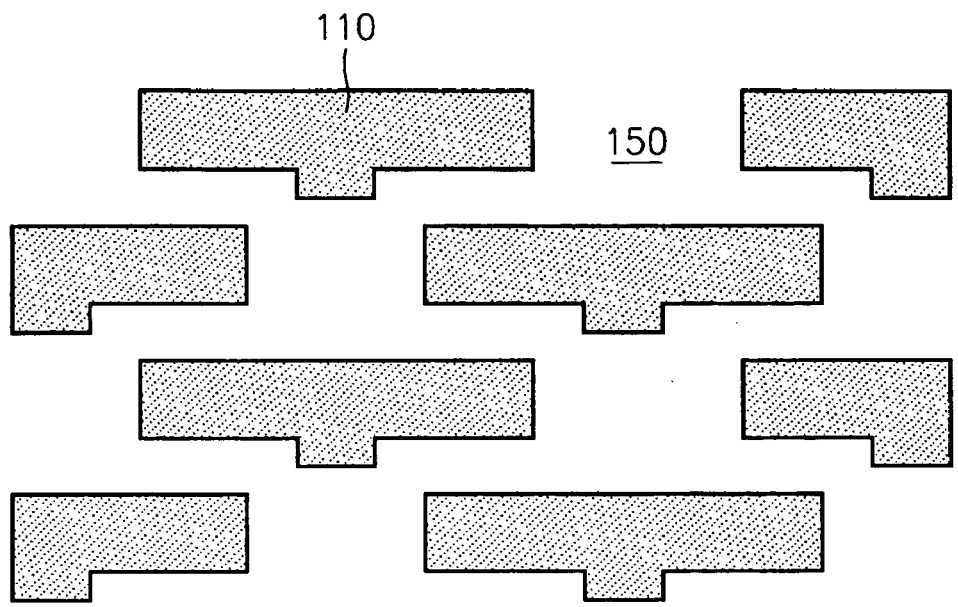
Figure 2B:
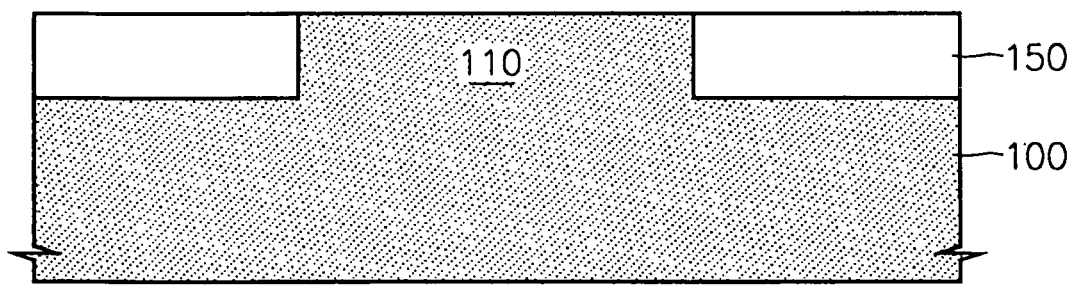

FIG. 2A is a top plan view illustrating an active region 110 is defined on a semiconductor substrate. FIG. 2B is a cross-sectional view taken along a major-axis direction of the active region 110 of FIG. 2A. Referring to FIGS. 2A and 2B, a device isolation region 150 is formed to define an active region 110 by applying a trench isolation process to a silicon semiconductor substrate 100. In addition, a trench may be formed to a depth of about 2500 Å to about 3000 Å in consideration of a design rule of a device. The device isolation region 150 determines the shape of the active region 110, e.g., as a "T" shape active region as illustrated in FIG. 2A.

Further, a photolithography process and an ion implantation process may be applied to the semiconductor substrate 100, to form a well (not shown), a channel of a transistor, and the like.

Figure 3A:
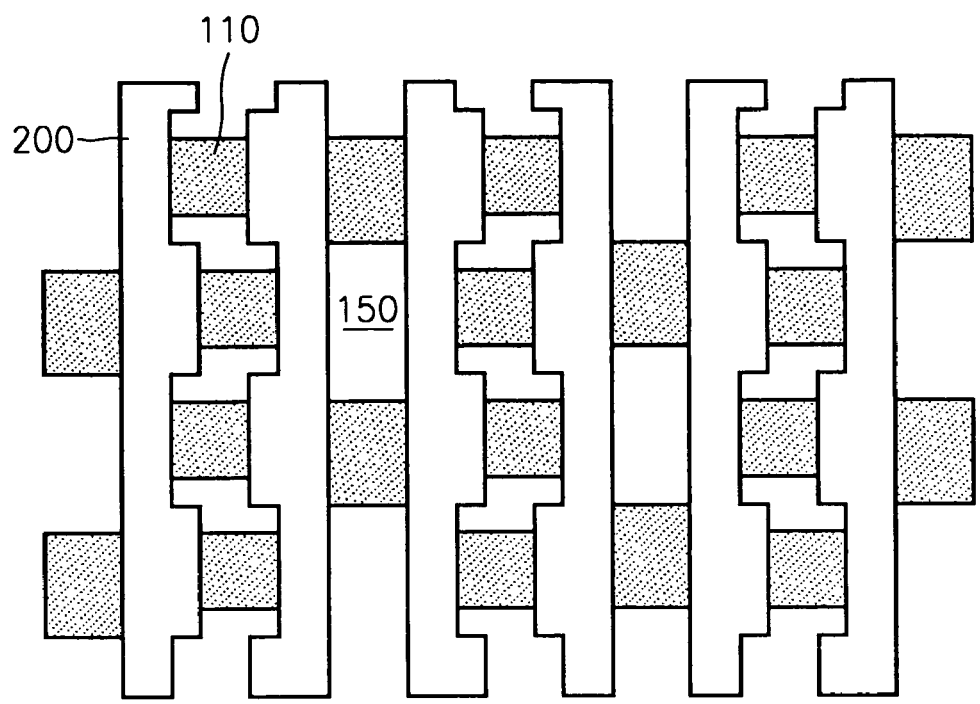
Figure 3B:
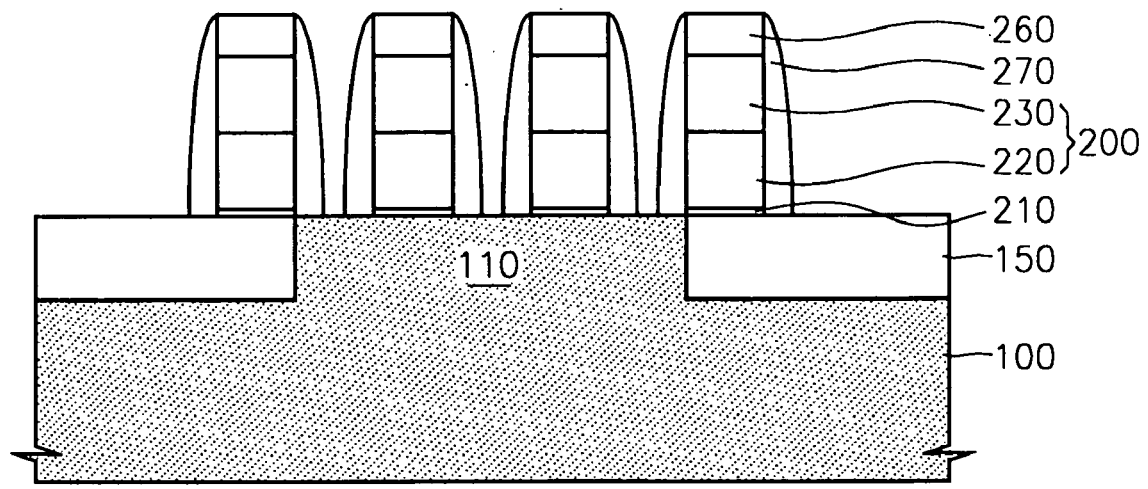

FIGS. 3A and 3B are a top plan view and a cross-sectional view, respectively, illustrating the formation of a gate line on the semiconductor substrate 100. Referring to FIGS. 3A and 3B, a plurality of gate patterns 200 are formed in lines across the active region 110. Preferably, an oxide layer (not shown), which is formed on the active region 110 during the ion implantation process, is removed using a wet etching process. Then, a thermal oxide layer is grown over the active region 110 to a thickness of about 40 Å to about 60 Å, thereby forming a gate oxide layer 210. The gate oxide layer 210 may be formed to a different thickness depending on characteristics of a desired device.

Next, gate layers 220 and 230 and a gate capping insulating layer 260 are sequentially formed on the gate oxide layer 210. The gate layers 220 and 230 may be formed of a conductive material, e.g., a conductive doped polysilicon layer may be deposited to the thickness of about 1000 Å as the gate layer 220, and a metal silicide layer (e.g., a tungsten silicide layer), which improves conductivity of the gate, may be formed to a thickness of about 1000 Å as the gate layer 230. Then, a silicon nitride layer may be formed on the tungsten silicide layer 230 to a thickness of about 2000 Å.

The silicon nitride layer is used as a capping insulating layer 260 prevents the gate from being damaged during a subsequent etching process.

Next, the capping insulating layer 260 and the gate layers 220 and 230 are successively patterned by photolithography and etching processes. Thus, a plurality of gate lines 200 are formed across the active region 110 as illustrated in FIG. 3A. Then, a photolithography process and an ion implantation process are performed with consideration of a characteristic and a region of an NMOS transistor or a PMOS transistor to be formed. Thus, a source region and a drain region of the transistor are formed in a lightly doped drain (LDD) structure.

Thereafter, an insulating layer (not shown) is deposited to cover the gate lines 200, and the gate lines 200 are etched to form gate spacers 270 that cover the sidewalls of the gate lines 200. Preferably, the gate spacers 270 are a silicon nitride.

Figure 4A:
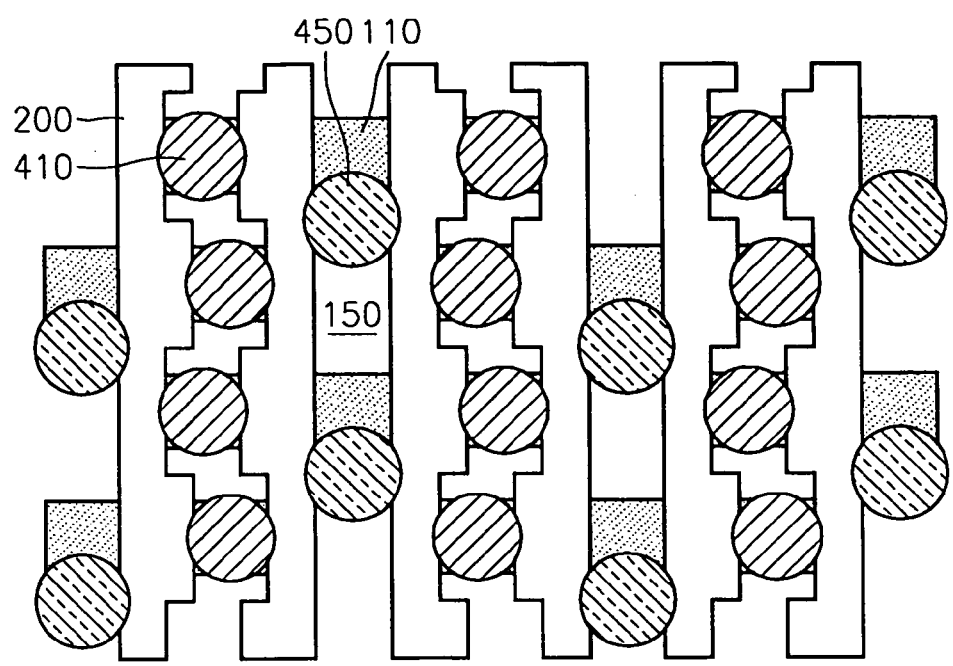
Figure 4B:
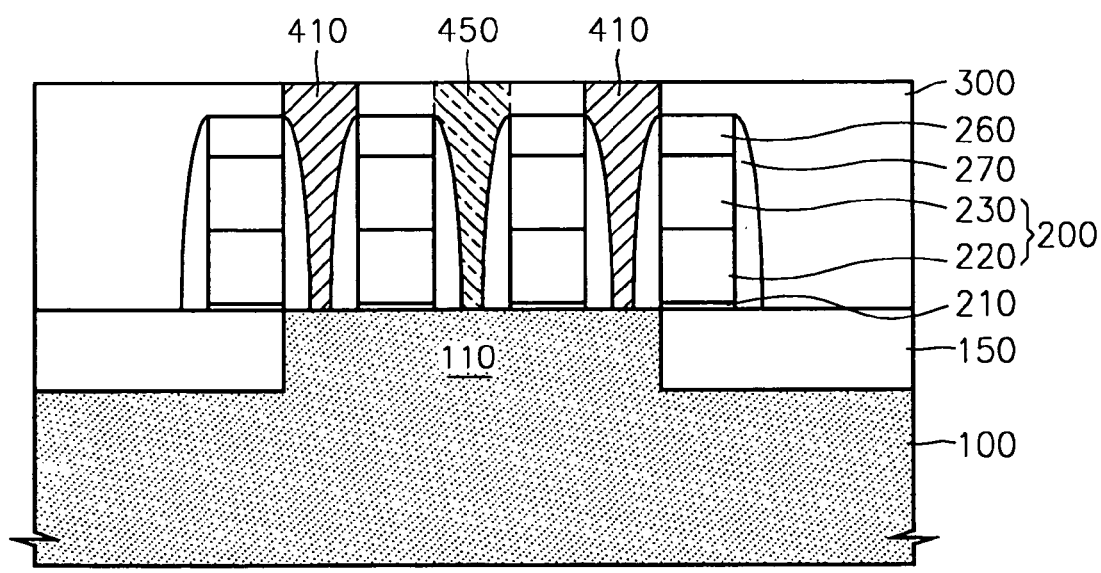

FIGS. 4A and 4B are a top plan view and a cross-sectional view, respectively, illustrating formation of contact pads 410 and 450. Referring to FIGS. 4A and 4B, a first insulating layer 300 is formed to fill portions disposed between the gate lines 200. The first insulating layer 300 may be formed of a silicon oxide layer, e.g., high density plasma (HDP) oxide or a borophosphosilicate glass (BPSG), which exhibit good gap filling characteristic. Afterwards, the top surface of the first insulating layer 300 is planarized using chemical mechanical polishing (CMP).

Next, a plurality of contact pads 410 and 450 are formed in the first insulating layer 300 by using a Self-Aligned Contact (SAC) process. The contact pads 410 and 450 can be classified into a first contact pad 410, i.e., a buried contact pad, and a second contact pad 450, i.e., a direct contact pad. In addition, the buried contact pad electrically connects the active region 110 to a storage electrode to be formed in a subsequent process. And, the direct contact pad electrically connects the active region 110 to a bit line, to be formed in a subsequent process. Further, the first and second contact pads 410 and 450, between which the gate line 200 is disposed, are disposed in diagonal directions to each other.

Forming the contact pads 410 and 450 may comprise a photolithography process and a selective etching process. Thus, portions of the first insulating layer 300, where bit line contacts and storage electrode contacts will be formed, are selectively removed, thereby forming first contact holes to form contact pads to expose the active region 110. Next, an ion implantation process is applied to the exposed portion of the active region 110 to lower a contact resistance between the active region 110 and contact pads 410 and 450 to be formed later. Then, a conductive layer, for example, a doped polysilicon containing n-type impurities, is deposited to the thickness of about 2500 Å to fill the first contact holes. Next, the conductive layer is etched using a dry etch process, such as an etchback or a CMP process, to expose the top surface of the first insulating layer 300. Thus, the contact pads 410 and 450, which fill the first contact holes, are obtained.

In addition, forming the contact pads 410 and 450 may comprise forming a band-type opening (not shown) using a SAC process to expose positions where a plurality of contact holes will be formed, forming a conductive layer to fill the opening, and then planarizing the conductive layer.

Figure 5A:
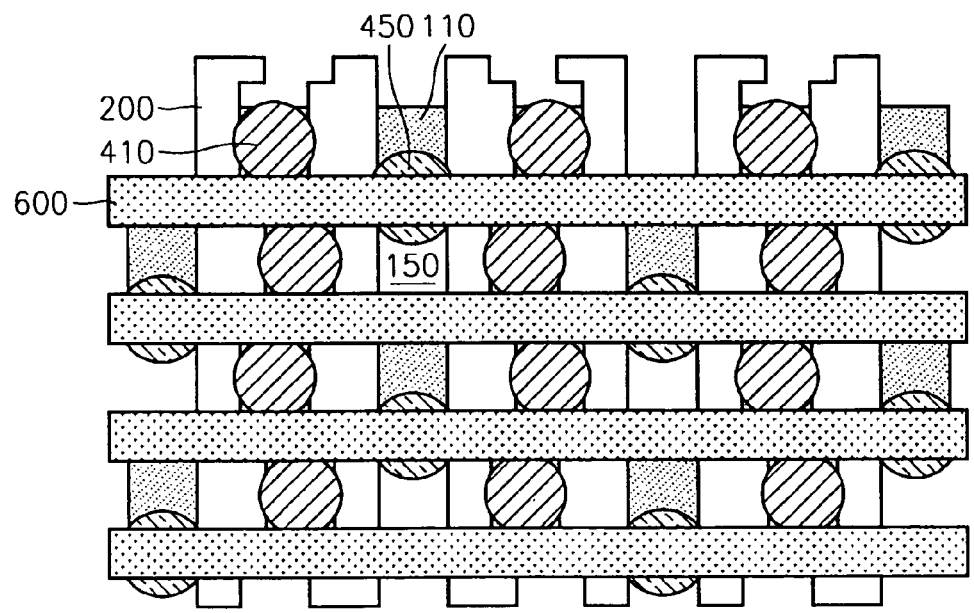
Figure 5B:
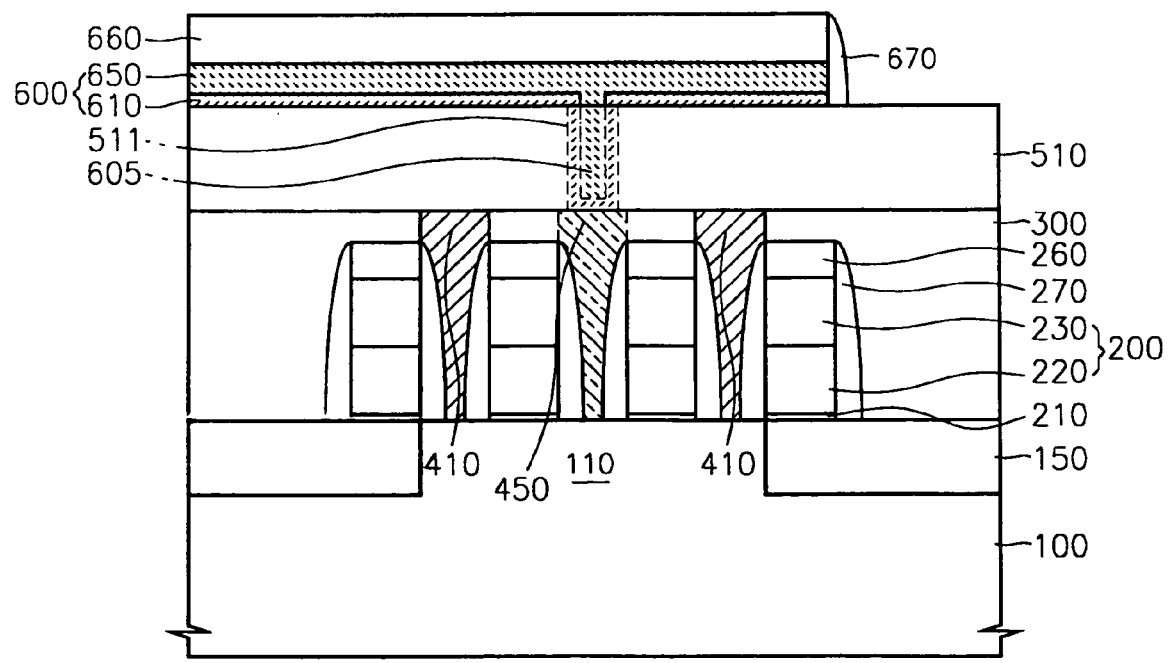

FIGS. 5A and 5B are a top plan view and a cross-sectional view, respectively, illustrating the resultant structure where the bit line 600 is formed. Referring to FIG. 5A and 5B, a second insulating layer 510 is formed on the first insulating layer 300 to cover the contact pads 410 and 450. The second insulating layer 510 insulates a bit line from the first contact pad 410, i.e., the buried contact pad. Preferably, the second insulating layer 510 is a silicon oxide layer.

Next, a second contact hole 511 is formed to expose a top surface of the second contact pad 450, i.e., the direct contact pad, by penetrating the second insulating layer 510. The second contact hole 511 is used to form a second contact, such as a direct contact, which will be used to electrically connect the second contact pad 450 and a bit line 600.

Then, the bit line 600 is formed and is electrically connected to the second contact pad 450. For example, a barrier metal layer 610 and a metal conductive layer 650, such as a tungsten layer, are deposited and patterned to form the bit line 600. A second contact 605, which fills the second contact hole 511, electrically connects the bit line 600 with the second contact pad 450. In other words, the second contact 605 forms a direct contact that electrically connects the bit line 600 with the second contact pad 450.

Then, a bit line capping insulating layer 660 and a silicon nitride layer may be formed over the bit line 600. In addition, bit line spacers 670 are formed on the sides of the bit line 600. Preferably, the bit line spacers 670 are formed from a silicon nitride. The capping insulating layer 660 and the spacer 670 are formed to prevent the bit line 600 from being damaged during a subsequent process of forming a storage electrode contact body, i.e., a buried contact layer.

Figure 6A:
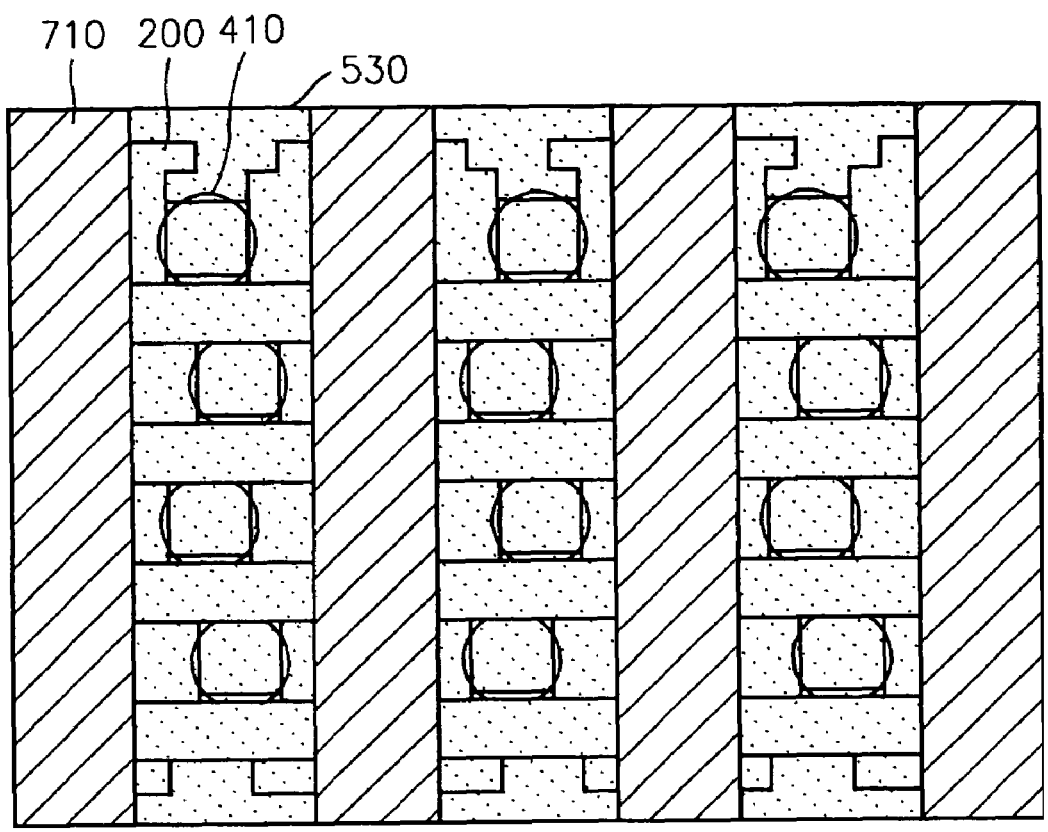
Figure 6B:
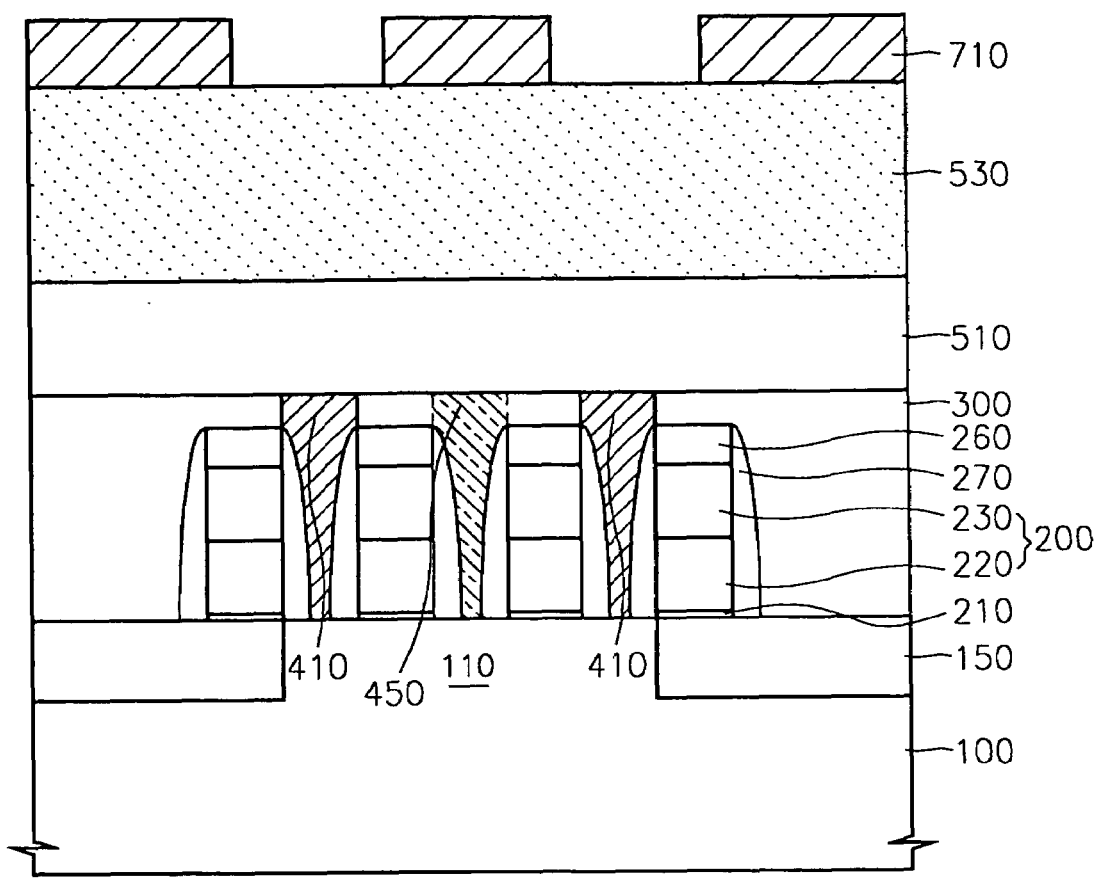

FIGS. 6A and 6B are a top plan view and a cross-sectional view, respectively, illustrating the formation of a first photoresist pattern 710 as a band-type on a third insulating layer 530 covering the bit line 600 (See FIGS. 5A and 5B). Referring to FIGS. 5A, 5B, 6A and 6B, after forming the bit line 600, a third insulating layer 530 is formed to cover the bit line 600. Preferably, the third insulating layer 530 is a silicon oxide having good gap filling characteristics, e.g., a HDP oxide or a BPSG. Then, the surface of the third insulating layer 530 is planarized as needed. Preferably, the planarizing process is a CMP.

A first photoresist pattern 710 is formed on the third insulating layer 530. The first photoresist pattern 710 is used during photolithography and etching processes for forming an opening. The opening is used to form a buried contact, i.e., a storage electrode contact body, to connect a first contact pad 410 with a storage electrode, to be formed later. The first photoresist pattern 710 is formed as a band-type on the third insulating layer 530 and exposes a portion of the third insulating layer 530 covering the plurality of first contact pads 410, which are disposed in rows. In addition, the first photoresist pattern 710 may be formed as either a line-type or a band-type pattern along the gate line 200.

The first photoresist pattern 710 is formed as a band shape to secure a wider resolution margin during the photolithography process for patterning the first photoresist pattern 710. With a photolithography process of lower resolution than required for the photolithography process for forming a contact hole exposing the first contact pad 410, it is possible to form the band-type first photoresist pattern 710 as described above. In other words, if ArF photolithography process is necessary to form a contact hole exposing the first contact pad 410, it is possible to form the foregoing first photoresist pattern 710 by using KrF photolithography process. This means an increase in a process margin for the photolithography process can be secured.

The first photoresist pattern 710 may be formed such that an exposed portion of the third insulating layer covering the first contact pad 410 is wider than the width of the first contact pad 410. Thus, the process margin required for the photolithography process for patterning the first photoresist pattern 710 can be increased. Nevertheless, if necessary, the first photoresist pattern 710 may be formed to expose a relatively narrow portion of the top surface of the first contact pad 410. Even when the first photoresist pattern 710 is formed to expose a relatively narrow portion of the first contact pad 410, the process margin required for the photolithography process can be increased. This is because a band-type pattern can increase a resolution margin required for a photolithography process more than a contact-type pattern.

Figure 7A:
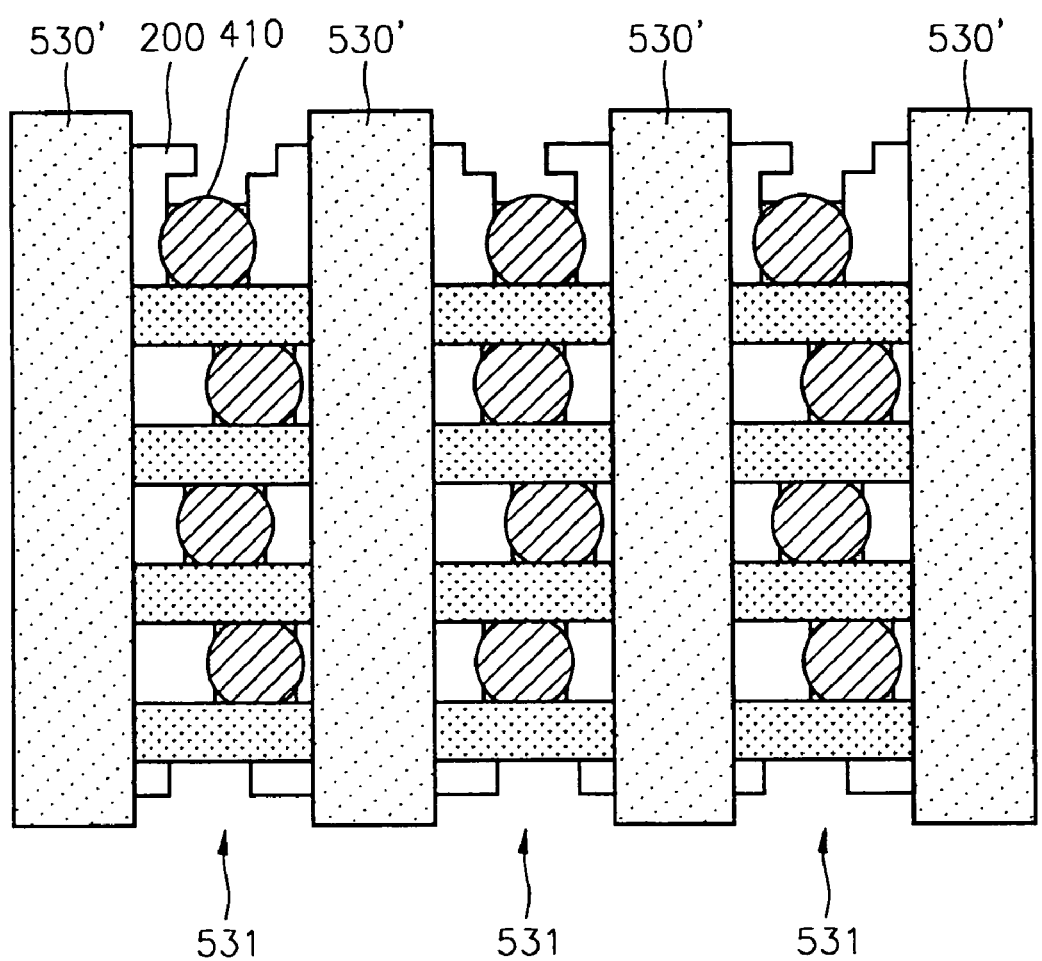
Figure 7B:
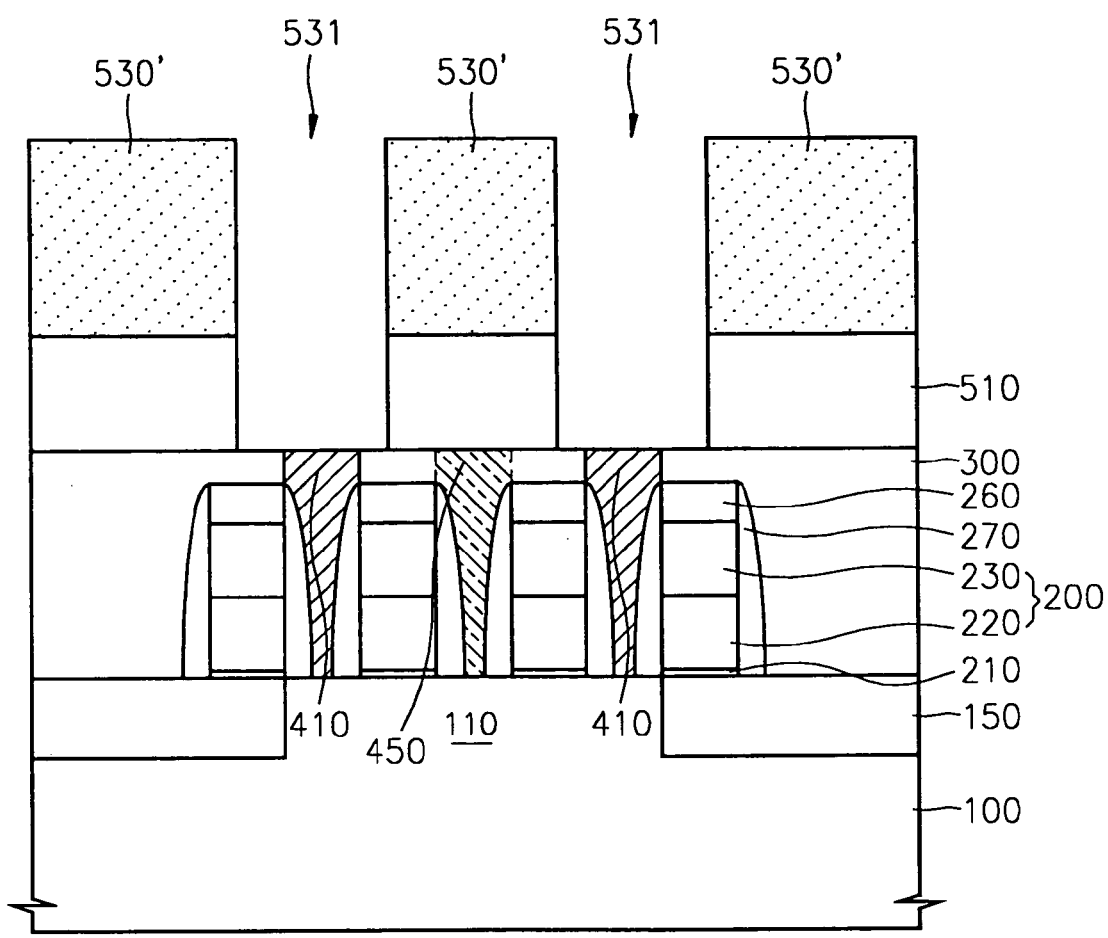

FIGS. 7A and 7B are a top plan view and a cross-sectional view, respectively, illustrating the formation of a band-type opening 531 to expose a plurality of first contact pads 410. Referring to FIGS. 7A and 7B, the exposed third insulating layer 530 is selectively etched by using the first photoresist pattern (710 of FIG. 6A) as an etch mask to form the band-type opening 531. If the third insulating layer 530 is a silicon oxide, a dry etch process may be applied to the silicon oxide. The etching process is performed to expose the top surface of the first contact pad 410.

Referring to FIGS. 5A, 5B, 7A and 7B, a band-type opening 531 is obtained by etching along the gate line 200. Thus, the plurality of first contact pads 410 are exposed in rows within the region exposed by the band-type opening 531. Also, the band-type opening 531 is formed across the bit lines 600 which are adjacent to the first contact pads 410. As illustrated in FIGS. 7B and 5B, since the sides and the tops of the bit lines 600 are prevented from being damaged during the etching process by the bit line spacer 670 and the bit line capping insulating layer 660, the bit lines 600 are not exposed by the band-type opening 531.

The width of the band-type opening 531 is determined by the width of the portion exposed by the first photoresist pattern 710. Thus, when the width of the third insulating layer 530, exposed by the first photoresist pattern 710, is wider than that of the first contact pad 410, the width of the band-type opening 531 is wider than that of the first contact pad 410. As the width of the band-type opening 531 increases, a misalignment between a storage electrode, to be formed later, and the first contact 410 may occur while still exposing the top surface of the first contact pad 410. Thus, an overlay margin is further increased.

As the band-type opening 531 is formed, a third insulating layer 530', which is patterned as the band shape, is formed along the gate line 200.

Further, although not shown in FIGS. 7A and 7B, a hard mask may be used under the first photoresist pattern (710 of FIG. 6A), if required for the etching process.

Figure 8A:
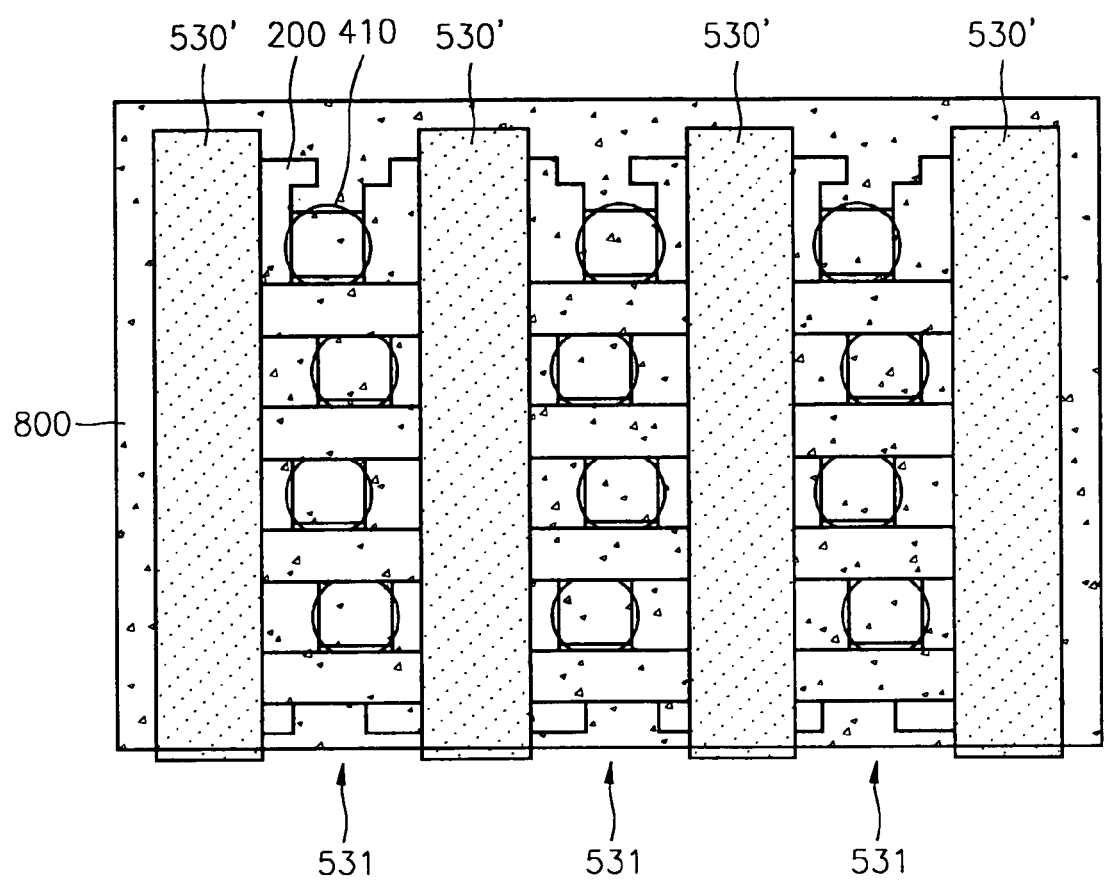
Figure 8B:
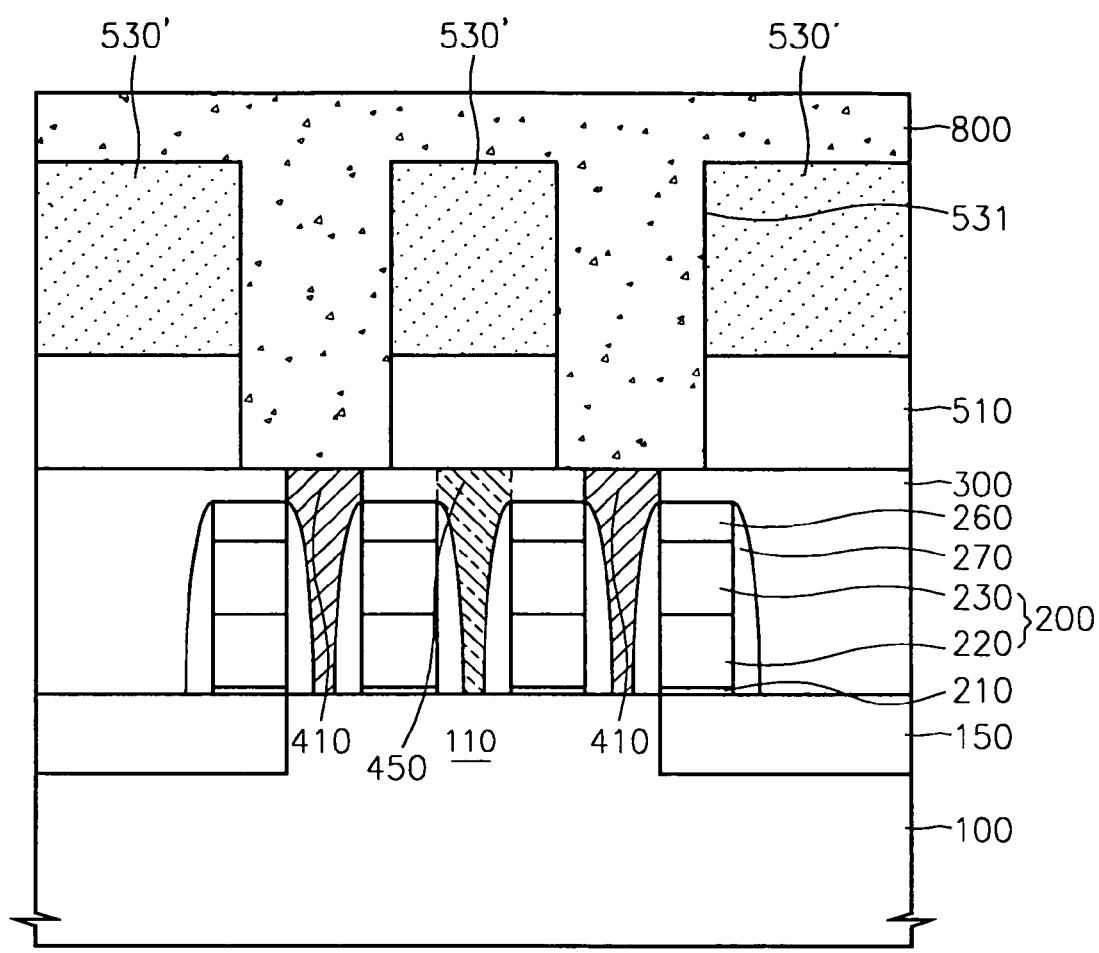

FIGS. 8A and 8B are a top plan view and a cross-sectional view, respectively, illustrating the formation of a conductive layer 800 on the third insulating layer 530' to fill the band-type opening 531. Referring to FIGS. 5A, 5B, 8A and 8B, the conductive layer 800 (e.g., a conductive polysilicon layer), which fills the band-type opening 531, is formed on the patterned third insulating layer 530'. The conductive layer may be thick enough to fill the band-type opening 531 using a CVD process. Preferably, the conductive layer 800, such as a conductive polysilicon layer, extends to cover the third insulating layer 530'. Actually, the conductive layer 800 covers the bit line capping insulating layer 660 and the bit line spacer 670, which cover the bit line 600 and are exposed by the band-type opening 531.

Figure 9A:
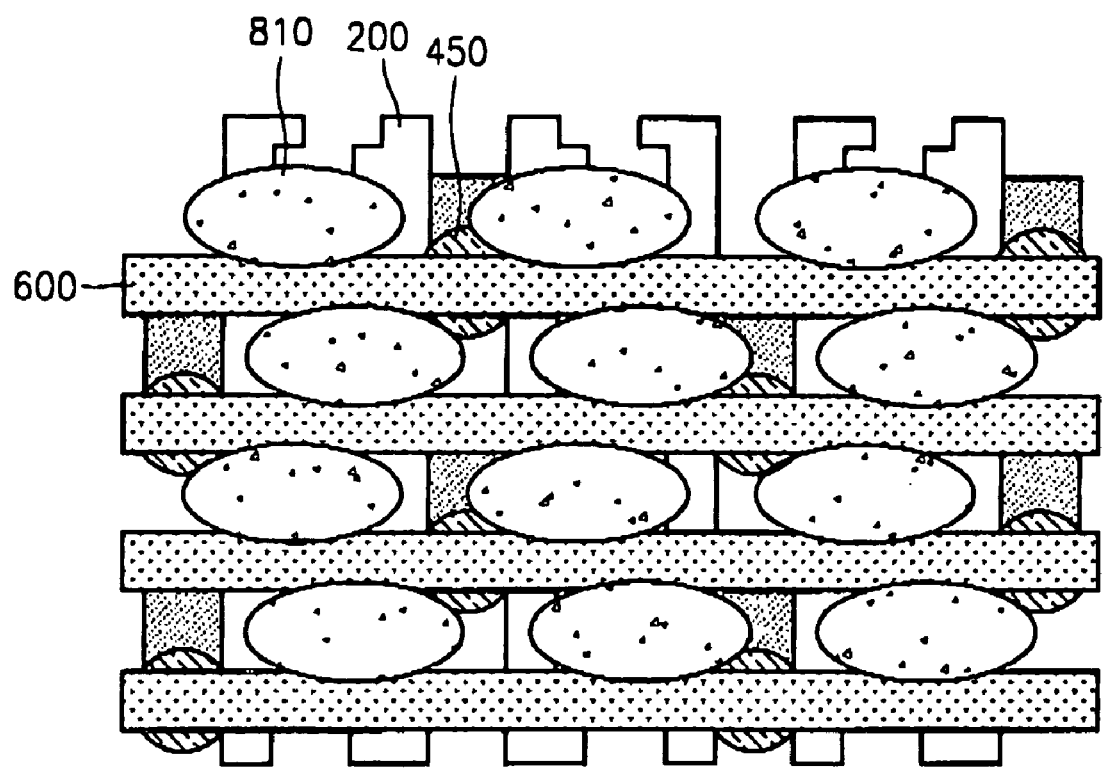
Figure 9B:
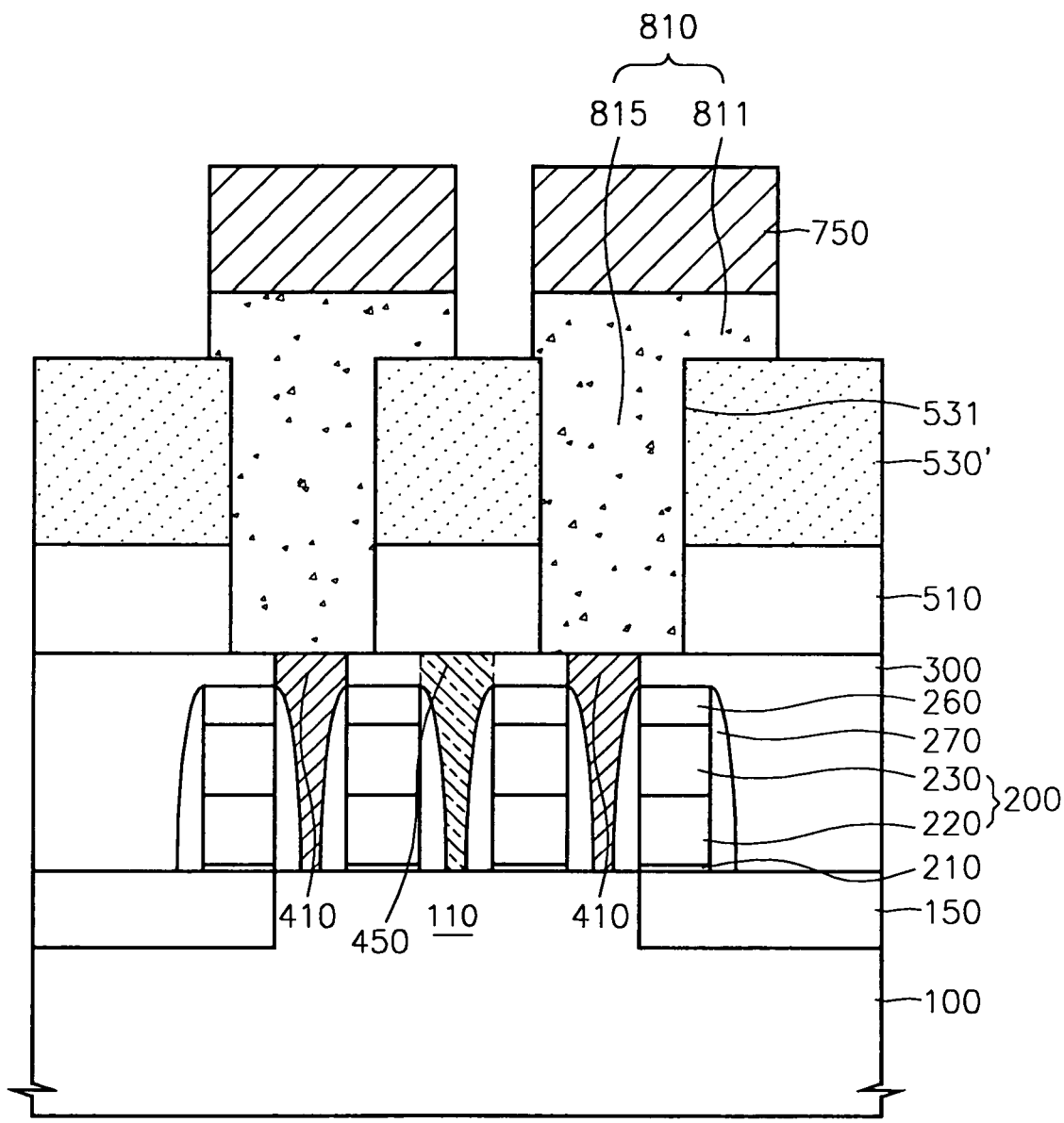

FIGS. 9A and 9B are a top plan view and a cross-sectional view, respectively, illustrating that the conductive layer 800 is separated into separate storage electrode contact bodies 810. Referring to FIGS. 9A and 9B, the conductive layer 800 is patterned using photolithography and etching processes and thus separated into individual storage electrode contact bodies 810, i.e., buried contacts. A second photoresist pattern 750 is formed on the conductive layer 800 and then used as an etch mask to selectively etch the exposed portion of the conductive layer 800. Preferably, the exposed portion of the conductive layer 800 is etched using a dry etch process. The etching process is carried out until the exposed portion of the conductive layer 800 is completely removed, thereby separating the conductive layer 800 into the individual storage electrode contact bodies 810.

Referring to FIGS. 5A, 5B, and 9A, because portions of the storage electrode contact bodies 810 overlap the bit lines 600, an etching process is carried out to expose a top surface of the bit line capping insulating layer 660 formed on the bit line 600 to completely separate the storage electrode contact bodies 810 along the gate lines 200. Also, when the etching process is performed until the top surface of the third insulating layer 530' is exposed, the separation of the storage electrode contact bodies 810 is completed along the bit lines 600. Because the top surface of the third insulating layer 530' is disposed higher than that of the bit line capping insulating layer 660, the separation process is completed when the top surface of the bit line capping insulating layer 660 is exposed. Preferably, a silicon nitride layer is used to form bit line capping insulating layer 660 and may be used as an etch stopper in the etching process during the separation process.

Figure 1:
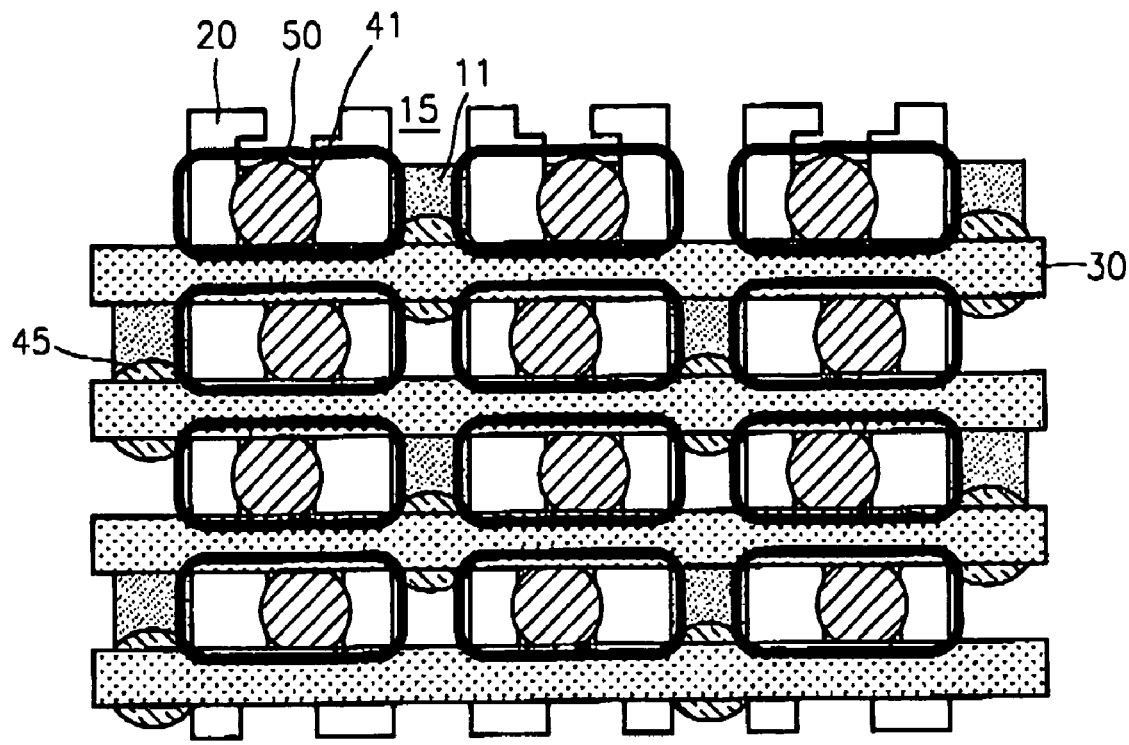
FIG. 1 is a top plan view illustrating a semiconductor device with a conventional storage electrode.

The storage electrode contact bodies 810 obtained by the separation process are formed to electrically connect the first contact pads 410 with storage electrodes to be formed in a subsequent process. In the preferred embodiments of the present invention, the storage electrodes are disposed in a new arrangement rather than in a matrix shape along the bit lines and the word lines as illustrated in FIG. 1.

For example, referring to FIGS. 5A, 5B and 9A, the storage electrodes are arranged in zigzag pattern in a direction of the bit lines 600. In other words, the adjacent storage electrodes are arranged in a diagonal direction from the bit lines 600. In addition, the storage electrodes are arranged to be zigzag pattern in a direction of the gate lines 200. In other words, the adjacent storage electrodes are arranged in a diagonal direction of the gate lines 200. The arrangement of the storage electrodes will be described in more detail with reference to the appended drawings.

However, when the storage electrodes are arranged in a diagonal direction of the bit lines 600 (See FIGS. 5A and 5B) or the gate lines 200, the center of the storage electrode may be misaligned from the center of the first contact pad 410. Thus, a top surface of the storage electrode contact body 810 is preferably extended in a direction of the bit line 600 (See FIGS. 5A and 5B) to electrically connect the storage electrode with the first contact pad 410.

Referring to FIGS. 5A, 5B, 9A and 9B, as the opening 531 is extended in a direction of the bit line 600 as described above, a body 811, which fills the opening 531 of the storage electrode contact body 810, may be extended in a direction of the bit line 600. Preferably, to increase the contact area between the storage electrode contact body 810 and the storage electrode, the storage electrode contact body 810 has an extension 811 at the top of the body 815. The extension 811 is a portion of the storage electrode contact body 810 that extends over the top of the third insulating layer 530' in a direction toward the bit line 600.

Preferably, the second photoresist pattern 750 is used as an etch mask to form the storage electrode contact body 810 having the extension 811. For example, the second photoresist pattern 750 is preferably formed to cover the portion of the conductive layer 800 such that the width of the second photoresist pattern 750 is wider than the opening 531 and forms the extension 811 along a major axis toward a bit line 600. (See FIGS. 5A, 5B, 9A and 9B). In other words, the second photoresist pattern 750 is preferably formed to allow the extension 811 to be extended in a direction of the bit line 600.

As illustrated in FIGS. 5A, 5B, 9A and 9B, the extension 811 of the patterned storage electrode contact body 810 is extended to cover a portion of the top of the third insulating layer 530' and the extension 811 is extended in a direction of the bit line 600. Preferably, the adjacent extensions 811, between which the bit line 600 is disposed, are preferably extended in opposite directions to each other. This allows the adjacent storage electrodes to be formed on the extension 811 are arranged in a diagonal direction of the bit line 600. In addition, the adjacent extensions 811 enable the extensions 811 to be aligned with and to overlap the storage electrode. Thus, a contact resistance between the storage electrode and the storage electrode contact body 810 can be reduced.

Further, a portion of the conductive layer 800 may be patterned as a resistor (not shown) during the etching process for separating the conductive layer 800 into the individual storage electrode contact bodies 810. The resistor is applied to a peripheral circuit region in a semiconductor device such as DRAM. Accordingly, although not shown in the drawings, the portion of the conductive layer 800, which is extended to the peripheral region of the semiconductor device, is used as the resistor. By forming the resistor using the conductive layer 800 during the etching process, the entire process for forming the semiconductor device can be simplified.

Figure 10A:
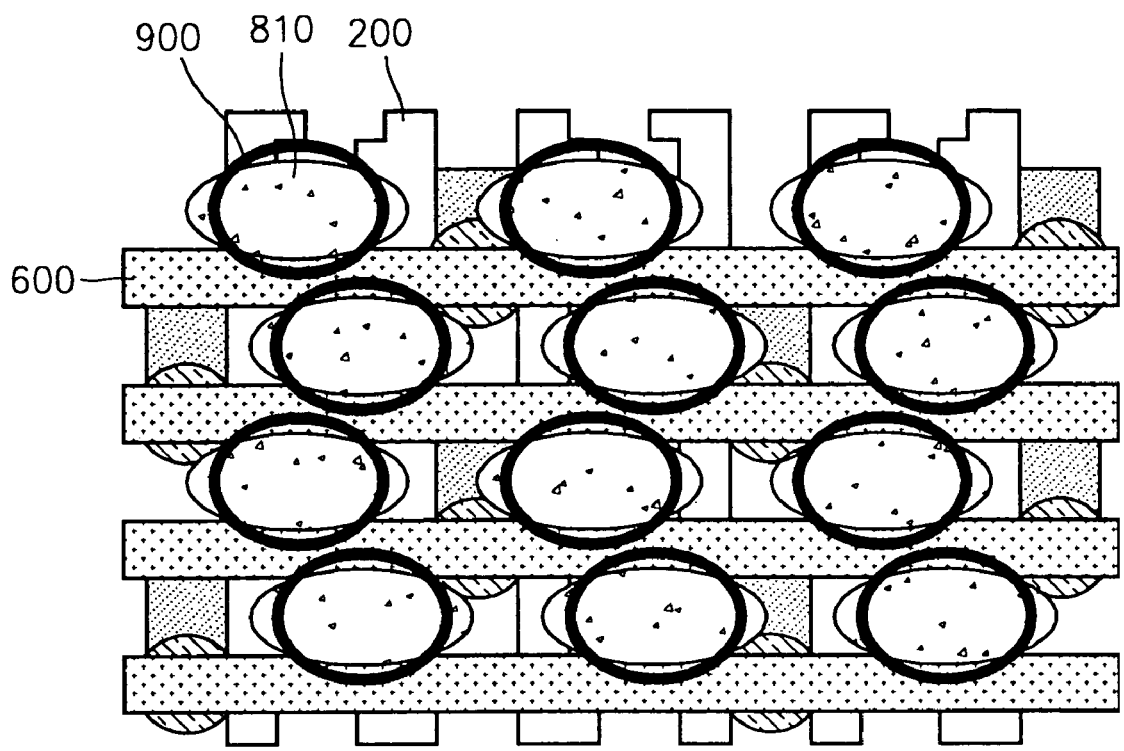
Figure 10B:
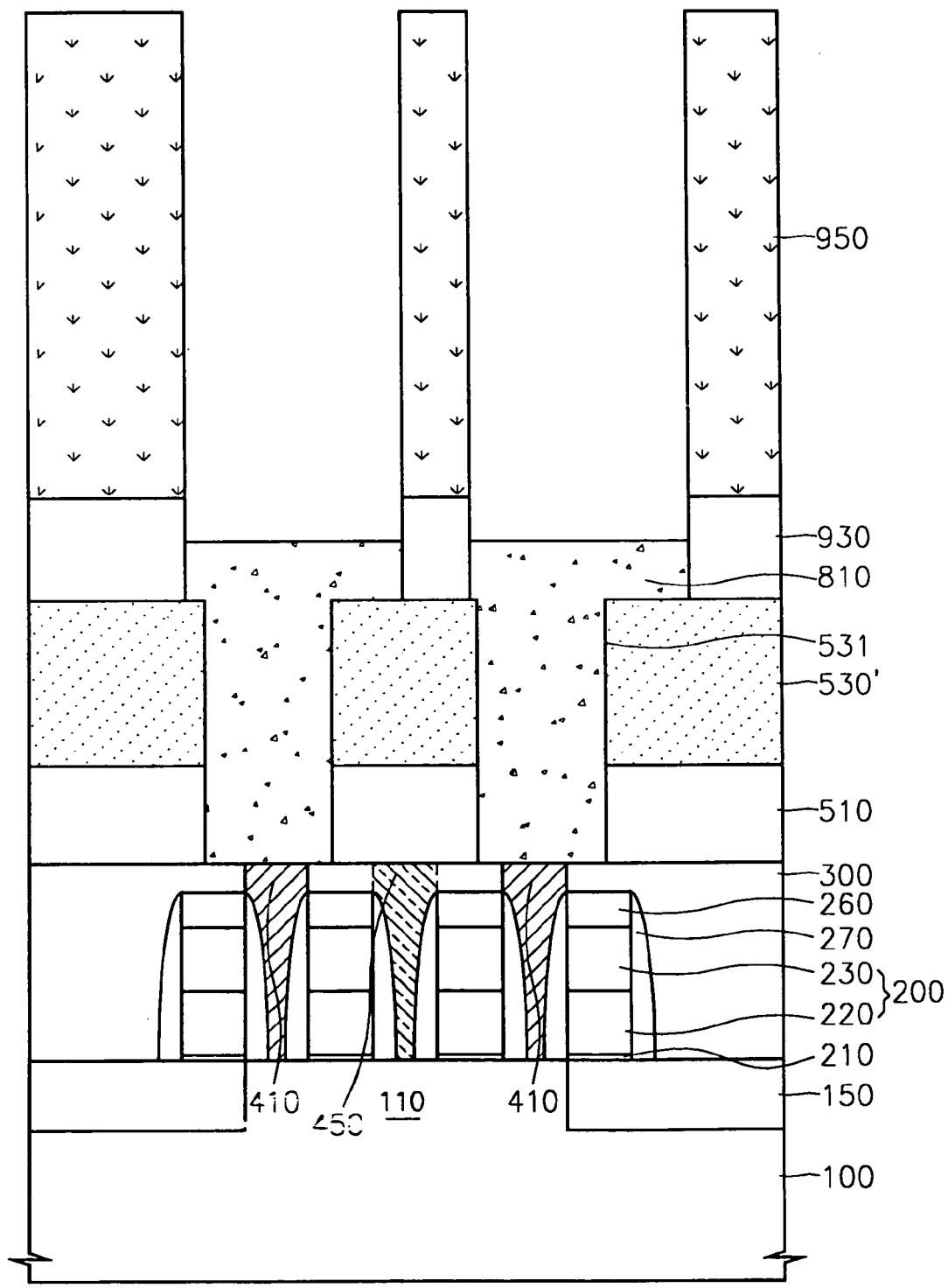
Figure 10C:
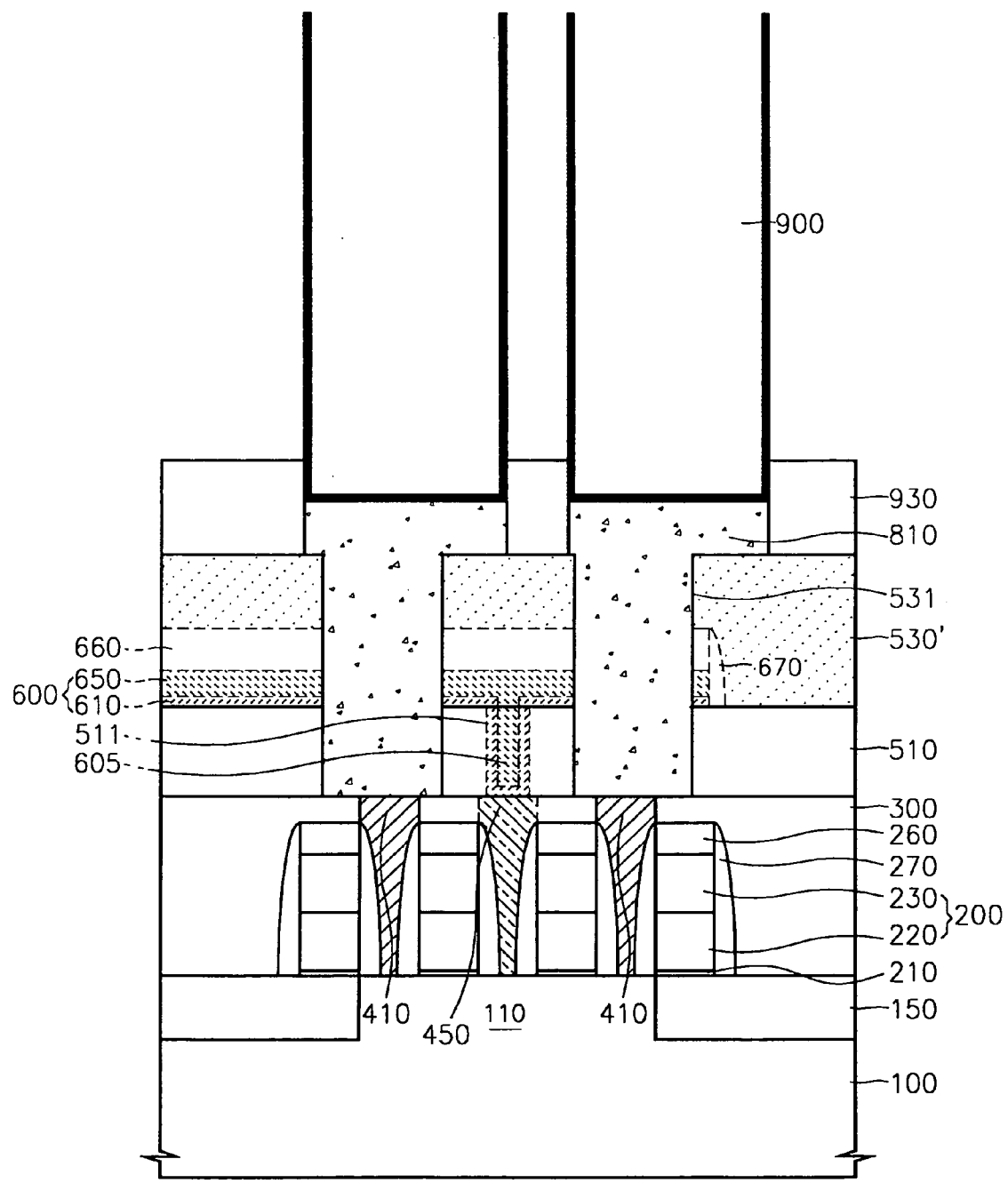

FIG. 10A is a top plan view and FIGS. 10B and 10C are cross-sectional views illustrating the formation of a storage electrode 900, according to another exemplary embodiment of the present invention.

FIG. 10A is a schematic top plan view illustrating the storage electrode 900 formed on the storage electrode contact body 810. FIG. 10B is a cross-sectional view illustrating a step of applying a mold layer 950 to form the storage electrode 900 in a cylindrical shape, and FIG. 10C is a cross-sectional view illustrating a step of forming the storage electrode 900.

Referring to FIGS. 10A, 10B, and 10C, the storage electrode 900, which is electrically connected to the storage electrode contact body 810, is formed in a cylindrical shape. The storage electrode 900 may also be formed as a circular, elliptical, or rectangular shape. As illustrated in FIG. 10A, the storage electrode 900 is arranged with other adjacent storage electrodes 900 in a diagonal direction from the bit lines 600 or the gate lines 200. In other words, the storage electrodes 900 are arranged in a zigzag pattern along the bit lines 600 or along the gate lines 200.

As the storage electrodes 900 are arranged as described above, a space interval therebetween is increased. Accordingly, the collapse of the storage electrode causing twin bit failure is prevented.

The storage electrodes 900 are disposed on the storage electrode contact bodies 810. As described above, because the storage electrode contact bodies 810 are formed to have the extensions 811 at the tops thereof along the bit lines 600, the contact area between the storage electrode contact body 810 and the storage electrode 900 is increased. Even though the center of the storage electrode 900 may be misaligned from the center of the first contact pad 410, the contact area between the storage electrode 900 and the first contact 410 can be secured by the storage electrode contact body 810 including an extension extending on a top surface of the third insulating layer 530 toward the bit line 600.

To form the storage electrode 900 as a 3-dimensional shape, such as a cylinder, a mold 950 as illustrated in FIG. 10B can be adopted. More specifically, a mold layer can be formed on the storage electrode contact body 810 and the third insulating layer 530' to a thickness of about 1500 nm.

A fourth insulating layer 930 may be additionally formed under the mold layer. Preferably, the fourth insulating layer 930 comprises a silicon oxide layer and a silicon nitride layer, wherein the silicon oxide layer serves as an electrode supporting layer and the silicon nitride layer serves as an etch stopper when the mold layer is subsequently removed.

The silicon nitride layer for an etch stopper may be formed to a thickness of about 500 Å. In addition, the electrode supporting layer may be omitted if necessary. The electrode supporting layer is preferably thick enough to cover the storage electrode contact body 810. Also, after forming the electrode supporting layer, a process for planarizing the surface of the electrode supporting layer may be added.

After forming the storage electrode 900, the mold layer formed on the fourth insulating layer 930 will be removed. Preferably, the mold layer is formed of a removable material such as plasma enhanced tetraethylosilicate (PETEOS).

After depositing the mold layer, a portion where the storage electrode 900 will be formed is selectively removed using photolithography and etching processes. Thus, the mold layer is patterned until the top surface of the storage electrode contact body 810 is exposed. Thus, the mold 950 is formed. Preferably, the etching process for forming the mold 950 is completed at the etch stopper layer, i.e., a silicon nitride layer.

Afterwards, the conductive layer is formed on the mold 950 and is extended to cover the top surface of the exposed storage electrode contact body 810. The conductive layer may be formed of conductive polysilicon to a thickness of about 400 to about 500 Å using CVD. In the case that a capacitor is formed as a metal-insulator-metal (MIM) structure, the conductive layer may be formed of a material used as an electrode of the MIM capacitor.

A sacrificial insulating layer (not shown) is deposited on the conductive layer to a thickness of about 3000 to about 6000 Å and then planarized using a dry etch process or chemical mechanical polishing (CMP). Thus, as illustrated in FIG. 10C, the conductive layer is separated into individual storage electrodes 900. For a tight separation, the planarizing process is performed until the top surface of the mold 950 is exposed. In other words, about 1000 to about 2000 Å of the sacrificial insulating layer is etched and removed by the planarizing process. Next, the sacrificial insulating layer and the mold 950 are selectively removed using a wet etch process having an etch selectivity with respect to polysilicon and silicon oxide. Thus, a cylindrical storage electrode 900 illustrated in FIG. 10C is formed.

According to exemplary embodiments of the present invention as described above, when a storage electrode contact body is formed using a contact hole, the misalignment can be minimized between the storage electrode contact body and a storage electrode. Furthermore, a band-type opening is formed and a conductive layer filling the opening is separated into individual storage electrode contact bodies through photolithography and etching processes. Thus, a body of the storage electrode contact body having an extension can be self-aligned to an extension which is integrally formed on the body.

Therefore, a misalignment can be prevented between layers, and also an overlay margin can be scaled down. In addition, as the extension and the body of the storage electrode contact body are integrally formed, any additional process for extending the storage electrode becomes unnecessary. For example, steps of adopting a buffer layer and planarizing or etching the buffer layer can be omitted.

When the storage electrode contact body is formed using a contact hole, the contact hole is typically formed using an ArF photolithography process in consideration of the pitch and resolution. However, the band-type opening can be formed using a KrF photolithography process.

According to exemplary embodiments of the present invention, the storage electrode contact body can be formed having a top portion that extends over an insulation layer in a direction toward a bit line. Further, storage electrodes can be arranged in the new arrangement by which the center of the storage electrode contact body is misaligned from the center of a buried contact pad disposed thereunder. In other words, the adjacent storage electrodes can be arranged in a diagonal direction from the bit lines or gate lines. Thus, a space interval between the storage electrodes is increased by the new arrangement. Therefore, a bridge between the storage electrodes, which is often caused in cylindrical storage electrodes, is eliminated.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method for manufacturing a semiconductor device comprising:
    forming gate lines on a semiconductor substrate;
    forming a first insulating layer to cover the gate lines;
    forming first contact pads and second contact pads, wherein the first contact pads and second contact pads are electrically connected to the semiconductor substrate between the gate lines by penetrating the first insulating layer;
    forming a second insulating layer to cover the first contact pads and the second contact pads;
    forming bit lines, wherein the bit lines cross over the gate lines and are electrically connected to the second contact pads by penetrating the second insulating layer;
    forming a third insulating layer to cover the bit lines;
    selectively etching the third insulating layer to form a band-type opening, wherein the band-type opening crosses the bit lines and exposes the first contact pads;
    forming a conductive layer on the third insulating layer to fill the band-type opening;
    patterning the conductive layer to form individual storage electrode contact bodies, wherein each of the contact bodies includes an extension that is extended on the third insulating layer along the length of the bit line and a body that is electrically connected to a first contact pad; and
    forming a storage electrode on each of the storage electrode contact bodies, and wherein the storage electrodes formed on the storage electrode contact bodies are arranged in a zigzag pattern along at least one of the bit lines or the gate lines.

2. The method as claimed in claim 1, wherein the first contact pads are disposed in a first column defined by a first and second gate line, and the second contact pads are disposed in a second column defined by the second and a third gate line.

3. The method as claimed in claim 1, wherein the band-type opening extends along the length of the gate line.

4. The method as claimed in claim 1, wherein the band-type opening is formed to expose the first contact pads and surrounding first insulation layer that are disposed between the gate lines.

5. The method as claimed in claim 1, wherein forming the band-type opening comprises:
    forming a band-type first photoresist pattern on the third insulating layer to expose portions of the third insulating layer which cover the first contact pads; and
    selectively etching the exposed portions of the second insulating layer by using the band-type first photoresist pattern as an etch mask.

6. The method as claimed in claim 1, wherein the conductive layer is a conductive polysilicon layer.

7. The method as claimed in claim 1, wherein patterning the conductive layer further comprises:
  forming a second photoresist pattern on the conductive layer to partially expose portions of the conductive layer overlapping the bit lines and portions of the conductive layer overlapping the second contact pads disposed between the gate lines; and
  etching the exposed portions of the conductive layer by using the second photoresist pattern as an etch mask.

8. The method as claimed in claim 1, wherein extensions of two adjacent storage electrode contact bodies, between which the bit line is disposed, extend in opposite direction from each other.

9. The method as claimed in claim 1, wherein the storage electrode contact body is formed such that a width of the extension along the length of the bit line is greater than that of the body.

10. The method as claimed in claim 1, wherein the storage electrode contact body is formed such that the width of the extension along the length of the bit line is greater than the extension along the length of the gate line.

11. The method as claimed in claim 1, wherein the storage electrodes are formed such that most adjacent storage electrodes, between which the bit line is disposed, are arranged at an angle from the bit line.

12. The method as claimed in claim 1, wherein the two adjacent storage electrodes are arranged at an angle from the bit line or the gate line.

13. The method as claimed in claim 1, wherein the storage electrode is formed in a 3-dimensional cylindrical shape.

14. The method as claimed in claim 1, wherein the storage electrode is formed to occupy a circular, elliptical, or rectangular area.

15. The method as claimed in claim 1, wherein a width of the band-type opening is greater than a width of the first contact pad.

16. The method as claimed in claim 15, wherein the band-type opening is formed to a width which allows a portion of the second insulating layer to remain on portions of the two gate lines adjacent to the second contact pads.

17. The method as claimed in claim 1, wherein forming the bit lines further comprises:
  forming a capping insulating layer to cover the bit lines; and
  forming spacers on sidewalls of the bit lines, wherein the capping insulating layer and the spacers prevent damage to the bit lines during the etching process.

18. The method as claimed in claim 17, wherein patterning the conductive layer is carried out by using the top surface of the capping insulating layer as an etch stopper.

19. The method as claimed in claim 1, wherein forming the storage electrode further comprises:
  forming an electrode supporting layer to cover the storage electrode contact bodies;
  forming a mold layer on the electrode supporting layer;
  patterning the mold layer to form a mold, wherein the mold forms the storage electrode into a 3-dimensional shape;
  forming a conductive layer on the mold;
  patterning the conductive layer to separate the conductive layer into individual storage electrodes; and
  selectively removing the mold.

20. The method as claimed in claim 19, wherein the electrode supporting layer further includes an etch stop layer that is used as an etch stopper when the mold is removed.

21. A method for manufacturing a semiconductor device comprising:
  selectively etching an insulating layer formed on a semiconductor device to form a band-type opening, wherein the band-type opening crosses bit lines and exposes first contact pads which are electrically connected to an active region in the semiconductor device;
  forming a conductive layer on the insulating layer to fill the band-type opening;
  patterning the conductive layer to form individual storage electrode contact bodies, wherein each of the contact bodies includes an extension that is extended on the insulating layer along the length of the bit line and a body that is electrically connected to a first contact pad; and
  forming a storage electrode on each of the storage electrode contact bodies, and wherein the storage electrodes formed on the storage electrode contact bodies are arranged in a zigzag pattern along at least one of the bit lines or the gate lines.

22. The method as claimed in claim 21, further comprising forming second contact pads which are electrically connected to the active region and the bit lines, wherein the first contact pads are disposed in a first column defined by a first and a second gate line, and wherein the second contact pads are disposed in a second column defined by the second and a third gate line.

23. The method as claimed in claim 21, wherein the band-type opening extends along the length of the gate line.

24. The method as claimed in claim 21, wherein extensions of the storage electrode contact bodies separated the bit line extend in opposite direction from each other.

25. The method as claimed in claim 21, wherein the storage electrode contact bodies are formed such that a width of the extensions along the length of the bit line is greater than that of the body.

26. The method as claimed in claim 21, wherein the storage electrode contact body is formed such that the width of the extension along the length of the bit line is greater than the extension along the length of the gate line.

27. The method as claimed in claim 21, wherein the storage electrode is formed in a 3-dimensional cylindrical shape.

28. The method as claimed in claim 21, wherein the storage electrode is formed to occupy a circular, elliptical, or rectangular area.

29. The method as claimed in claim 21, wherein forming the storage electrode comprises:
  forming an electrode supporting layer to cover the storage electrode contact bodies;
  forming a mold layer on the electrode supporting layer;
  patterning the mold layer to form a mold, wherein the mold forms the storage electrode into a 3-dimensional shape;
  forming a conductive layer on the mold;
  patterning the conductive layer to separate the conductive layer into individual storage electrodes; and
  selectively removing the mold.

30. The method as claimed in claim 29, wherein the electrode supporting layer further includes an etch stop layer that is used as an etch stopper when the mold is removed.

31. The method as claimed in claim 21, wherein the band-type opening is formed to expose the first contact pads disposed between the gate lines.

32. The method as claimed in claim 31, wherein a width of the band-type opening is greater than a width of the first contact pad.

33. The method as claimed in claim 32, wherein the band-type opening is formed to a width which allows a second insulating layer to remain on portions of the gate lines adjacent to the second contact pad.

* * * * *